(12) United States Patent
Parker et al.

(10) Patent No.: US 7,170,298 B2
(45) Date of Patent: *Jan. 30, 2007

(54) METHODS FOR TESTING CONTINUITY OF ELECTRICAL PATHS THROUGH CONNECTORS OF CIRCUIT ASSEMBLIES

(75) Inventors: Kenneth P. Parker, Fort Collins, CO (US); Jacob L. Bell, Vancouver, WA (US)

(73) Assignee: Agilent Technologies, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/175,783

(22) Filed: Jul. 5, 2005

(65) Prior Publication Data

US 2005/0242826 A1 Nov. 3, 2005

Related U.S. Application Data

(62) Division of application No. 10/683,693, filed on Oct. 9, 2003, now Pat. No. 6,933,730.

(51) Int. Cl.
*G01R 31/04* (2006.01)
*G01R 31/02* (2006.01)

(52) U.S. Cl. ............................ 324/538; 324/537

(58) Field of Classification Search ............... 324/538, 324/537, 548, 549, 686, 688, 750, 755, 158.1, 324/763

See application file for complete search history.

(56) References Cited

U.S. PATENT DOCUMENTS

| | | | |
|---|---|---|---|
| 3,806,800 A * | 4/1974 | Bove et al. ................. 324/538 |
| 4,583,042 A | 4/1986 | Riemer | |
| 5,159,526 A | 10/1992 | Marek | |
| 5,175,547 A | 12/1992 | Lyon et al. | |
| 5,420,500 A | 5/1995 | Kerschner | |
| 5,432,460 A | 7/1995 | Flecha et al. | |
| 5,498,964 A | 3/1996 | Kerschner et al. | |
| 5,557,209 A | 9/1996 | Crook et al. | |
| 6,087,842 A | 7/2000 | Parker et al. | |
| 6,097,202 A | 8/2000 | Takahashi | |
| 6,097,203 A | 8/2000 | Parker et al. | |
| 6,798,225 B2 * | 9/2004 | Miller ....................... 324/754 |
| 6,960,917 B2 * | 11/2005 | Parker et al. ............... 324/538 |
| 2001/0040464 A1 * | 11/2001 | Tanioka et al. ............. 324/765 |
| 2005/0077907 A1 | 4/2005 | Parker et al. | |

FOREIGN PATENT DOCUMENTS

| EP | 0805356 | 1/1997 |
|---|---|---|
| GB | 2143954 | 2/1985 |
| GB | 2353399 | 8/1999 |

* cited by examiner

*Primary Examiner*—Anjan Deb

(57) ABSTRACT

In one embodiment, a method for testing continuity of electrical paths through a circuit assembly includes: 1) mating a test-facilitating circuit package to a connector of the circuit assembly; the circuit package having a plurality of contacts for mating to a plurality of contacts of the connector; the circuit package containing incomplete or no mission circuitry for the circuit assembly, but containing a plurality of passive circuit components coupled in parallel between the package's plurality of contacts and a test sensor port of the circuit package; 2) stimulating one or more nodes of the circuit assembly; 3) measuring an electrical characteristic of the circuit package; and 4) comparing the measured electrical characteristic to at least one threshold to assess continuities of at least two electrical paths through the circuit assembly. Other embodiments are also disclosed.

4 Claims, 6 Drawing Sheets

METHODS FOR TESTING CONTINUITY OF ELECTRICAL PATHS THROUGH CONNECTORS OF CIRCUIT ASSEMBLIES

CROSS-REFERENCE TO RELATED APPLICATION

This is a divisional of application Ser. No. 10/683,693 filed on Oct. 9, 2003 now U.S. Pat. No. 6,933,730, which is hereby incorporated by reference herein.

BACKGROUND OF THE INVENTION

During manufacture, circuit assemblies (e.g., printed circuit boards and Multi-Chip Modules) need to be tested for interconnect defects such as open solder joints, broken connectors, and bent or misaligned leads (e.g., pins, balls, or spring contacts). One way to test for such defects is via capacitive lead-frame testing.

FIGS. 1 & 2 illustrate an exemplary setup for capacitive lead-frame testing. FIG. 1 illustrates a circuit assembly 100 comprising an integrated circuit (IC) package 102 and a printed circuit board 104. Enclosed within the IC package is an IC 106. The IC is bonded to the leads 108, 110 of a lead-frame via a plurality of bond wires 112, 114. The leads, in turn, are meant to be soldered to conductive traces on the printed circuit board. Note, however, that one of the leads 108 is not soldered to the printed circuit board, thereby resulting in an "open" defect.

Positioned above the IC package 102 is a capacitive lead-frame test assembly 116. The exemplary test assembly 116 shown comprises a sense plate 118, a ground plane 120, and a buffer 122. The test assembly is coupled to an alternating current (AC) detector 124. A first, grounded test probe, TP_1, is coupled to lead 110 of the IC package. A second test probe, TP_2, is coupled to lead 108 of the IC package. The second test probe is also coupled to an AC source 126.

FIG. 2 illustrates an equivalent circuit for the apparatus shown in FIG. 1. In the equivalent circuit, $C_{sense}$ is the capacitance seen between the sense plate 118 and the lead 108 being sensed, and $C_{joint}$ is the capacitance seen between the lead 108 and the conductive trace (on the printed circuit board) to which the lead is supposed to be soldered. The switch, S, represents the quality of the lead being tested. If the lead being tested is good, switch S is closed, and the capacitance seen by the AC detector is $C_{sense}$. If the lead being tested is bad, switch S is open, and the capacitance seen by the AC detector is $C_{sense}*C_{joint}/(C_{sense}+C_{joint})$. If $C_{sense}$ is chosen to be significantly larger than any possible $C_{joint}$, a bad lead will result in the AC detector seeing a capacitance near $C_{joint}$. As a result, the AC detector must have sufficient resolution to distinguish $C_{sense}$ from $C_{joint}$.

Additional and more detailed explanations of capacitive lead-frame testing are found in U.S. Pat. No. 5,557,209 of Crook et al. entitled "Identification of Pin-Open Faults by Capacitive Coupling Through the Integrated Circuit Package", and in U.S. Pat. No. 5,498,964 of Kerschner entitled "Capacitive Electrode System for Detecting Open Solder Joints in Printed Circuit Assemblies".

Over the years, various factors have interfered with the success of capacitive lead-frame testing. One factor is a lack of capacitive coupling between an IC lead-frame and a tester's sense plate. This problem is largely traced to the on-going miniaturization of IC packages and their lead-frames, as well as the imposition of ground shield and heat sinks between lead-frames and the sensor plate (some of which are internal to an IC's package). The miniaturization of lead-frames is also exacerbated by "area connection" packages. In an area connection package, the package's lead-frame is laid out as an array on a surface of the package, rather than in rows along the edges of the package. Examples of package area connections include ball grid arrays (BGAs; a lead-frame comprising a plurality of solder balls on a surface of a package) and land grid arrays (LGAs; a lead-frame comprising a plurality of stenciled or screened contact pads on a surface of a package). Area connection packages can be advantageous in that they often minimize the lengths of signal traces coupling a package's IC to its lead-frame. However, they can also interfere with capacitive lead-frame testing in that they sometimes make it difficult to position the sense plate of a capacitive lead-frame tester in close enough proximity to their lead-frames.

One way to address some of the problems of IC miniaturization is disclosed in U.S. Pat. No. 6,087,842 of Parker et al. entitled "Integrated or Intrapackage Capability for Testing Electrical Continuity Between an Integrated Circuit and Other Circuitry". This patent teaches the placement of a capacitive sensor interior to an IC package. If the placement of such sensor is carefully chosen, the capacitive coupling between the sensor and a package's lead-frame can be increased—in part because the interior placement of the capacitive sensor can circumvent shielding and heat dissipation structures of the IC package.

Another factor that has interfered with the success of capacitive lead-frame testing is the ratio of non-signal leads to total leads on an IC package. As ICs have become more complex and operate at higher frequencies, the ratio of non-signal leads as a fraction of total leads has increased. Typically, the non-signal leads supply power and ground connections, and are redundantly connected in parallel (either on a printed circuit board, within an IC package, or within an IC itself). Capacitive lead-frame testing is not designed to detect opens on such leads. Thus, a significant fraction of IC leads could suffer from opens that cannot be tested.

Yet another factor that has interfered with the success of capacitive lead-frame testing is socket-mounted IC packages. These packages do not mount directly to a board, but are mounted in sockets that allow them to be added or replaced after a board is manufactured. This adds a layer of complexity to testing in that proper connection between the board and package requires proper connection between the board and socket. If the package is placed in the socket, both sets of connections (i.e., between board and package, and between board and socket) can be tested at once via In-Circuit test, Boundary-Scan test, capacitive lead-frame test, and so on. However, all of these techniques depend on the inserted device's inherent testability for opens coverage; and even if the inserted device is suited to application of these techniques, only signal leads will be adequately tested, and redundant power and ground connections will only be "grossly" tested. If the inserted device has poor testability, neither the inserted device nor the socket will be adequately tested.

SUMMARY OF THE INVENTION

In one embodiment, a method for testing continuity of electrical paths through a circuit assembly comprises: 1) mating a test-facilitating circuit package to a connector of the circuit assembly; the circuit package comprising a plurality of contacts for mating to a plurality of contacts of the connector; the circuit package containing incomplete or no mission circuitry for the circuit assembly, but containing a plurality of passive circuit components coupled in parallel between the package's plurality of contacts and a test sensor port of the circuit package; 2) stimulating one or more nodes of the circuit assembly; 3) measuring an electrical characteristic of the circuit package; and 4) comparing the measured electrical characteristic to at least one threshold to assess continuities of at least two electrical paths through the circuit assembly.

In another embodiment, a method for testing continuity of electrical paths through a circuit assembly comprises: 1) mating a test fixture to a connector of the circuit assembly; the test fixture supporting one or more test-facilitating circuit packages; the circuit packages comprising a plurality of contacts for electrically coupling to a plurality of contacts of the connector; the circuit packages containing incomplete or no mission circuitry for the circuit assembly, but containing a plurality of passive circuit components coupled in parallel between the packages' plurality of contacts and test sensor ports of the circuit packages; 2) stimulating one or more nodes of the circuit assembly; 3) measuring an electrical characteristic of one or more of the circuit packages; and 4) comparing the measured electrical characteristic(s) to at least one threshold to assess continuities of at least two electrical paths through the circuit assembly.

Other embodiments of the invention are also disclosed.

BRIEF DESCRIPTION OF THE DRAWINGS

Illustrative and presently preferred embodiments of the invention are illustrated in the drawings, in which.

DESCRIPTION OF THE PREFERRED EMBODIMENT

Figure 1:
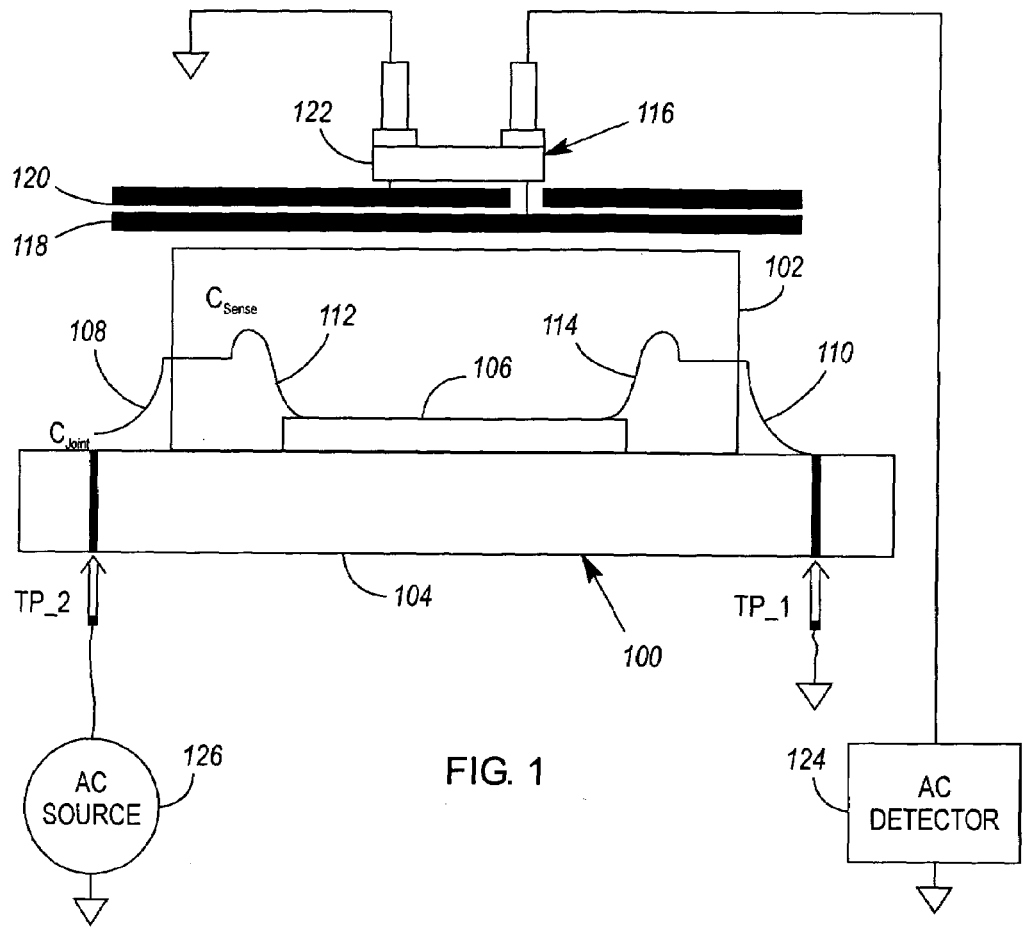
FIGS. 1 & 2 illustrate an exemplary setup for capacitive lead-frame testing.
Figure 2:
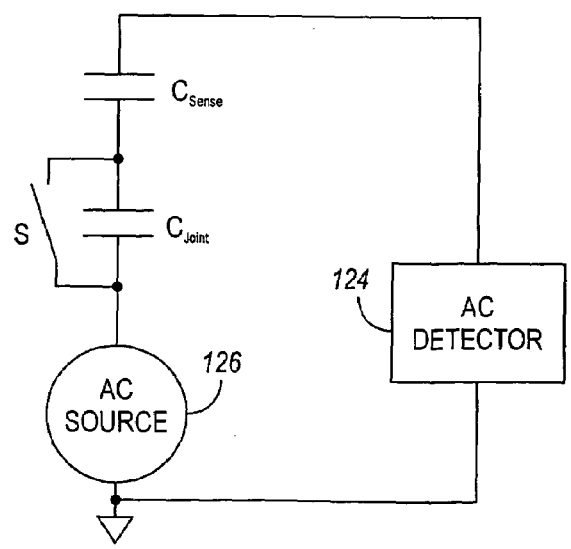
Figure 3:
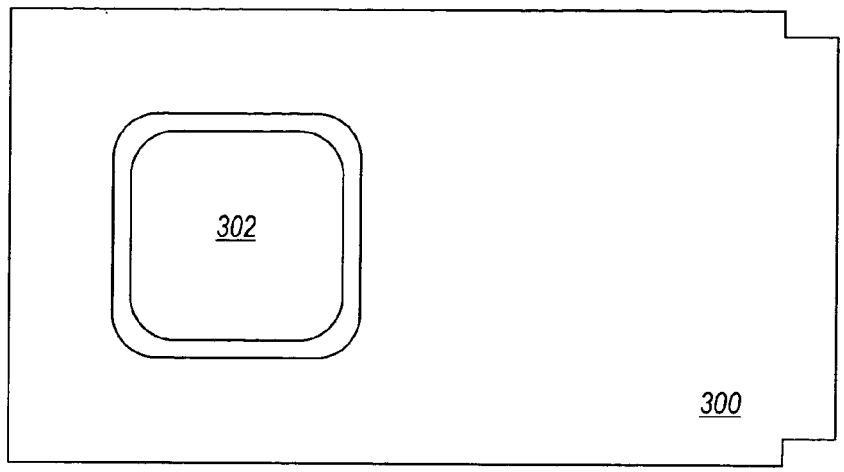
FIGS. 3 & 4 illustrate circuit assemblies comprising various forms of connectors.
Figure 4:
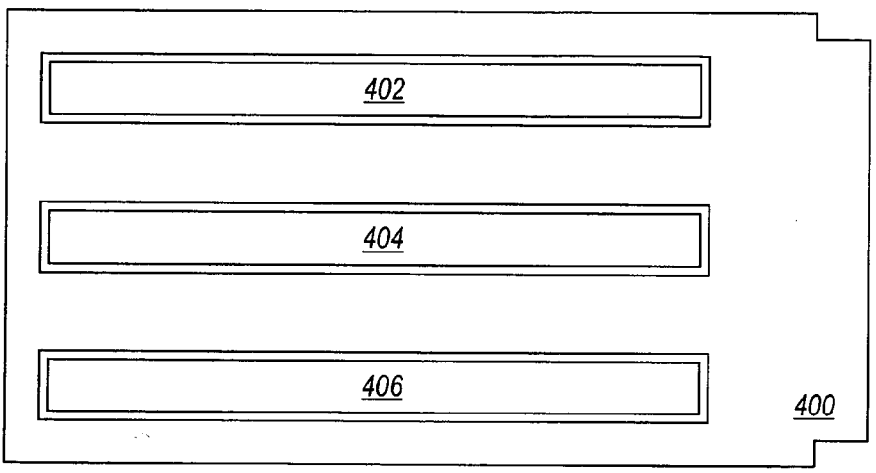
Figure 5:
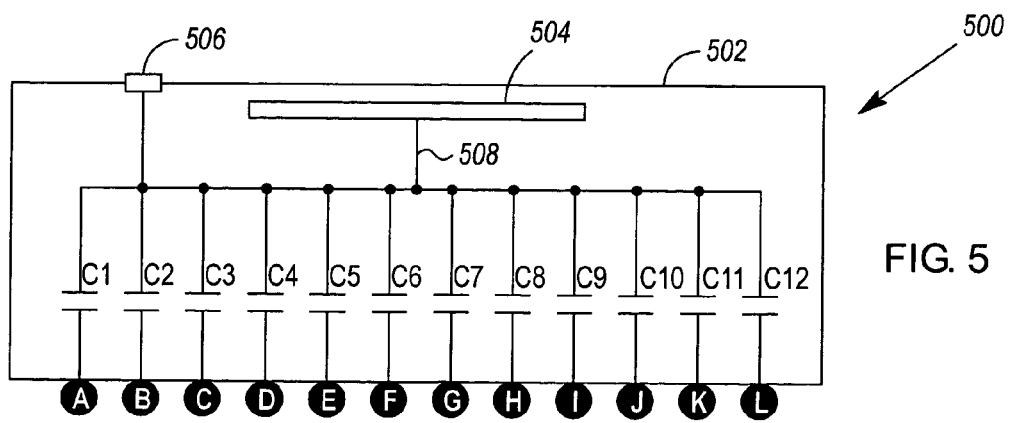
FIG. 5 illustrates a first exemplary embodiment of a device for testing continuity of electrical paths through a connector of a circuit assembly, wherein a number of parallel connected passive circuit components comprise capacitors.

FIGS. 3 & 4 illustrate circuit assemblies 300, 400 comprising various forms of connectors (e.g., a socket 302 for receiving an integrated circuit (IC) package, and connectors 402, 404, 406 for receiving random access memory (RAM) modules). FIG. 5 illustrates a first exemplary embodiment of a device 500 for testing continuity of electrical paths through a connector of a circuit assembly. By way of example, the device 500 is configured to test the IC socket 302 shown in FIG. 1.

The device 500 comprises a package 502 containing incomplete or no mission circuitry for the circuit assembly 300 of which the connector under test 302 forms a part. If the device contains no mission circuitry, the device 500 may be produced based on the structural design of the connector 302, and without any knowledge of the functional design of the circuit assembly 300.

The package 502 is provided with a plurality of contacts (identified as contacts A–L) for mating to a plurality of contacts of the connector under test 302. As shown in FIG. 5, the contacts on the package may comprise solder balls of a ball grid array (BGA). The contacts could also take the form of a land grid array (LGA), pins, or other forms of contacts (e.g., PBGA, TBGA, CBGA, CCGA, CLGA, HiTCE, or organic/laminate contacts).

A test sensor port integrated with the package 502 may take one or more of a plurality of forms. For example, as shown in FIG. 5, the test sensor port could comprise one or both of a capacitor plate 504 and an ohmic contact 506. If the test sensor port comprises a capacitor plate, the plate could take the form of an external capacitor plate or, as shown, a capacitor plate 504 that is enclosed within the package 502 so that it may be coupled to using the package 502 as a dielectric.

Figure 6:
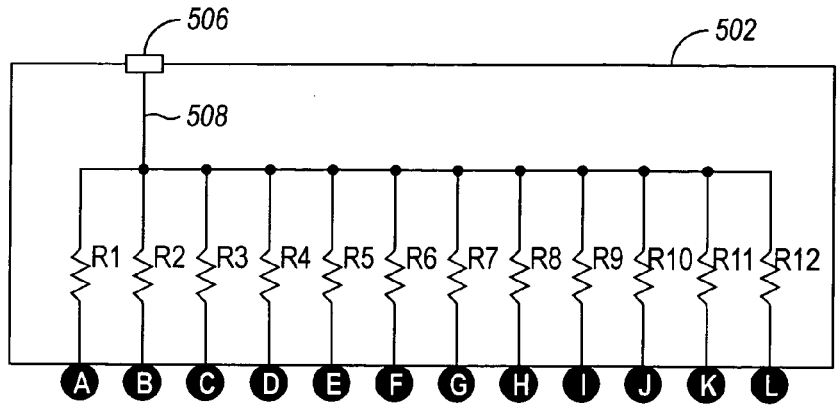
FIG. 6 illustrates a second exemplary embodiment of a device for testing continuity of electrical paths through a connector of a circuit assembly, wherein a number of parallel connected passive circuit components comprise resistors.

Integrated with (and possibly enclosed within) the package 502 is a plurality of passive circuit components (identified as capacitors C1–C12) that are coupled in parallel between ones of the plurality of contacts A–L on the package 502 and the test sensor port 504, 506. In FIG. 5, the passive circuit components are shown to be capacitors, each of which is coupled between a different one of the package contacts and a common internal circuit node 508. However, as shown in FIG. 6, the passive circuit components could take other forms, such as resistors R1–R12.

In the device embodiment shown in FIG. 5, the values of the parallel capacitors C1–C12 are substantially matched. That is, the relative variation between the capacitors (or error $\epsilon$) is kept to a small value, such as 0.5%. So long as the error $\epsilon$ is small and the value that the capacitors approach is small compared to the normal values of capacitance between contacts of a connector under test, the actual value that the capacitors approach need not be closely controlled. Thus, for example, if the normal values of capacitance between contacts of a connector under test are around one picoFarad (pF), the value that the parallel capacitors approach may be 15 femtoFarads (fF) ±0.25%, or alternately, 14.5 fF ±0.25%. Modeling considerations, however, may require keeping the values of the parallel capacitors within some sort of desired value (e.g., 15 fF ±5%). The values of the parallel capacitors may be kept small compared to the normal values of connector capacitance so that insertion of the device 500 into a connector under test 302 will not add significant additional capacitance between contacts of the connector, which may be an important factor for some tests of a circuit assembly.

To match the values of the parallel capacitors, those of the capacitors nearest the periphery of the package 502 may need to be sized differently than those of the capacitors nearest the center of the package.

Figure 7:
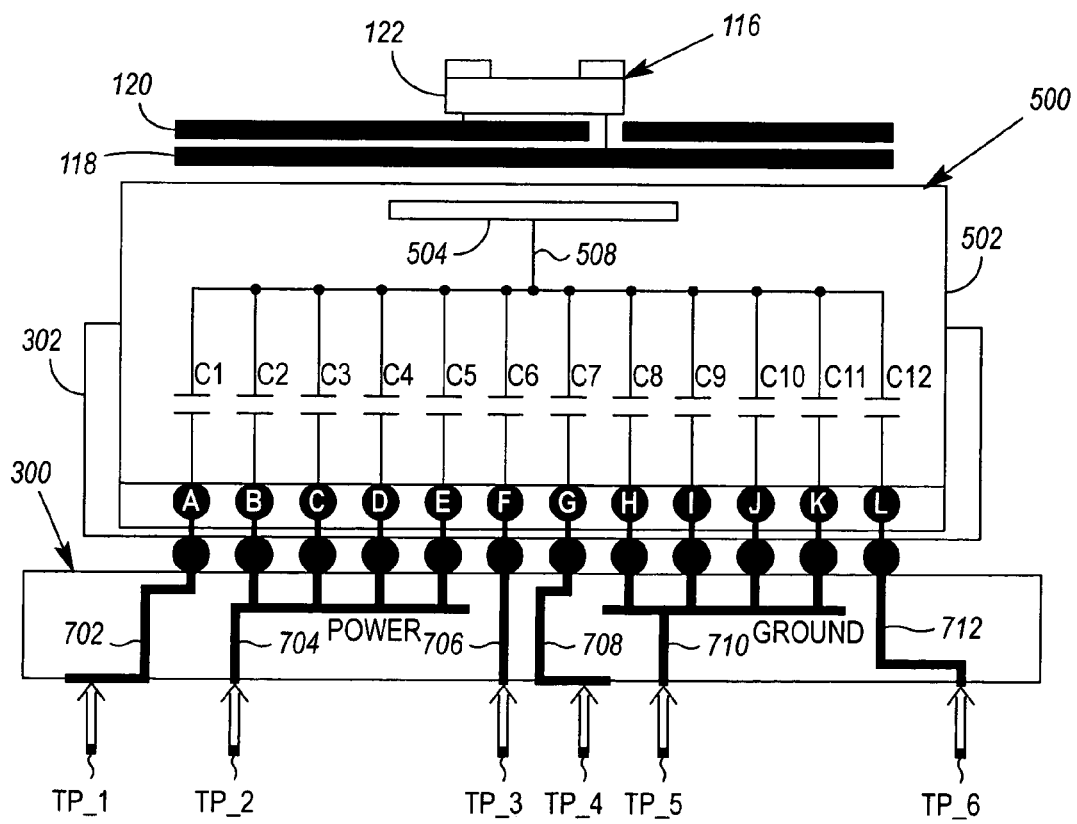
FIG. 7 illustrates a third exemplary embodiment of a device for testing continuity of electrical paths through a connector of a circuit assembly, wherein the device is mated to the connector and a capacitive lead-frame test assembly is coupled to the device.

Assume now that the device 500, configured as described in the above paragraph, is used to test a circuit assembly 300. To prepare for test, the device 500 is mated to a connector 302 of the circuit assembly 300, as shown in FIG. 7. A capacitive lead-frame test assembly 116 is then coupled to the test sensor port 504 of the device 500. In FIG. 7, the device's test sensor port comprises a buried capacitor plate 504 but no ohmic contact. As a result, the capacitive lead-frame assembly 116 comprises a sense plate 118 for capacitively coupling to the device 500. The buried capacitor plate 504 may be large and relatively close to the surface of the package 502 so that the capacitance between the sense plate 118 and the capacitor plate 504 is large compared to the values of the capacitors C1–C12. In this manner, the capacitance between the plate 504 and sensor 116 will have minimal impact on measuring the combined value of the capacitance seen by node 508 (as will be described below).

Those nodes of the circuit assembly 300 that are coupled to contacts A–L of the connector under test 302 are coupled to a number of test probes (e.g., probes TP_1, TP_2, TP_3, TP_4, TP_5 and TP_6). By way of example, these test probes could be included in a "bed of nails" test fixture.

After preparing the circuit assembly 300 for test, one or more nodes of the circuit assembly are stimulated (e.g., via an AC signal source) while other nodes of the circuit assembly are preferably grounded (to reduce noise and extraneous signal pickup). An exemplary test sequence might commence with the stimulation of node 702 while all other nodes 704–712 are grounded. If the connector 302 is in good condition, and is properly coupled to node 702, then node 702 should be shorted to contact A of the device 500, and the capacitance seen at node 508 should be equal to $C \pm \epsilon$. (NOTE: for purposes of this discussion, it is assumed that the value of each of the capacitors C1–C12 is equal to C.) If the connector 302 is defective, or is not properly coupled to node 702, the resultant open between node 702 and contact A will result in a small capacitance being placed in series with capacitor C1, thus reducing the capacitance seen by node 508. For example, if the value of C is 15 fF, and the capacitance contributed by the open is 1 fF, then the capacitance seen by node 508 will be approximately 0.94 fF. This change in the capacitance seen at node 508 (from 15 fF to 0.94 fF), if detectable by the sensitivity of the capacitive lead-frame sensor 116 (and if greater than $\epsilon$), can be used to determine that an open exists in the circuit assembly 300.

A test of the circuit assembly 300 may continue with the stimulation of node 704 while all other nodes 702, 706–712 are grounded. Note that node 704 is a power plane that couples contacts B–E of the device 500. If the connector 302 is in good condition, and is properly coupled to node 704, then node 704 should be shorted to contacts B–E of the device, and the capacitance seen at node 508 should be equal to $4C \pm 4\epsilon$. If the connector is defective, or is not properly coupled to node 704, then one or more small capacitances will be placed in series with one or more of the capacitors C2–C5, and the capacitance seen at node 508 will deteriorate. For example, if the value of C is 15 fF, and an open at one contact of the device 500 contributes 1 fF of capacitance, the capacitance seen by node 508 will be approximately 45 fF. Again, this change in the capacitance seen at node 508 (from 60 fF to 45 fF), if detectable by the sensitivity of the capacitive lead-frame sensor 116 (and if greater than $4\epsilon$), can be used to determine that an open exists in the circuit assembly 300.

The remaining signal nodes 706, 708, 712 and ground plane 710 may be tested similarly to nodes 702 and 704.

In the arrangement illustrated in FIG. 7, the sense plate 118 of the capacitive lead-frame test assembly 116 may pick up stray capacitance from the circuit assembly under test 300. There is a possibility that this stray capacitance could mask opens. Some sort of shielding may therefore be desirable. However, the shielding should not be tied to the ground plane 710 of the circuit assembly 300, since this could impact a test of properly connected redundancies in the circuit assembly's ground plane. As a result, the shielding could be connected to signal ground (i.e., the reference from which stimuli applied to the circuit assembly 300 are measured). If the shielding is not grounded and merely "floats", it adds another capacitance in series with the measurement path.

Figure 8:
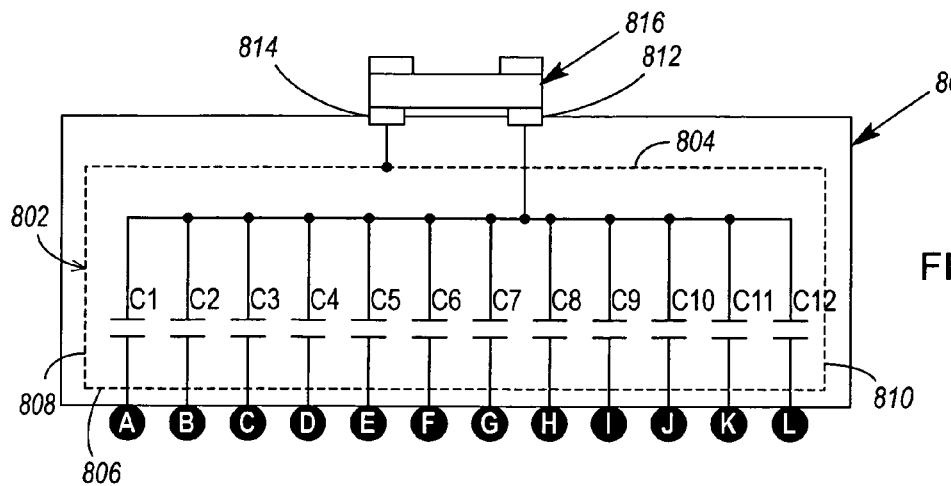
FIG. 8 illustrates a fourth exemplary embodiment of a device for testing continuity of electrical paths through a connector of a circuit assembly, wherein the device incorporates a ground shield.

FIG. 8 illustrates a test device 800 incorporating a ground shield 802. The ground shield 802 surrounds a plurality of passive circuit components (e.g., parallel capacitors C1–C12), and has holes therein through which component contacts and other signal wires may be routed. The ground shield 802 may be variously configured, but in one embodiment comprises a first ground plane 804 positioned above the plurality of passive circuit components, a second ground plane 806 positioned below the plurality of passive circuit components, and a number of conductive vias 808, 810 coupling the first and second ground planes.

By way of example, the test sensor port of the device 800 may comprise a first ohmic contact 812 for reading the value of the parallel capacitors C1–C12, and a second ohmic contact 814 for coupling to the ground shield 802. In this manor, a capacitive lead-frame test assembly 816 may couple the ground shield 802 to signal ground while reading the capacitance of the device 800 at contact 812.

Figure 9:
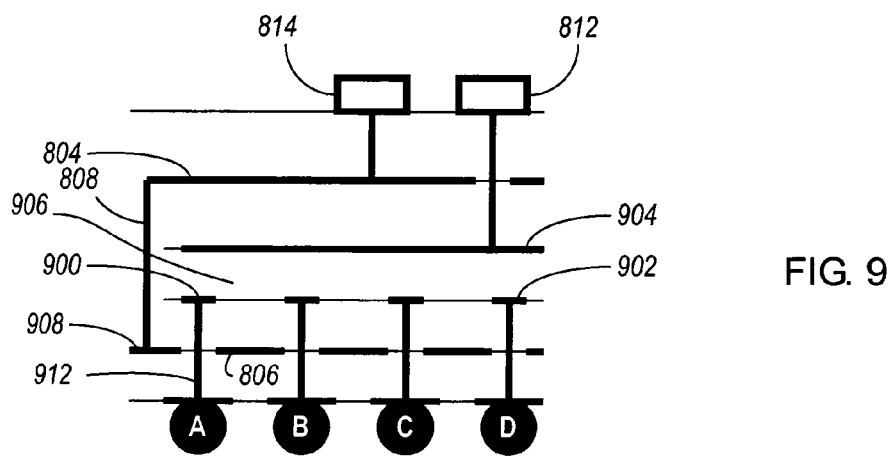
FIG. 9 illustrates one exemplary embodiment of the layers that form the device shown in FIG. 8.

FIG. 9 shows one exemplary embodiment of the layers that form the device 800 shown in FIG. 8. The layers comprise 1) a first conductive layer having first sides 900, 902 of the capacitors patterned therein, 2) a second conductive layer having second sides 904 of the capacitors patterned therein, and 3) a dielectric layer 906 separating the first and second conductive layers. The second sides of the capacitors may be individually formed or, as shown, may be formed by one continuous conductor 904. To ensure substantially equal values of the capacitors, the composition and thickness of the dielectric layer 906 should be carefully controlled. Widths of the first sides 900, 902 of the capacitors should also be carefully controlled. Upper vias 908, 910 may be used to couple the conductor 904 to ohmic contact 812, and to couple the ground plane 804 to ohmic contact 814. Lower vias (e.g., via 912) may be used to couple the first sides 900, 902 of the capacitors to external contacts such as solder balls A–D.

While the capacitors shown in FIG. 9 are plate-type capacitors, they need not be. Alternatively, the capacitors could be formed by parallel traces, the spacing and length of which are controlled to yield a desired capacitance. The capacitors could also be formed by concentric cylinders having an engineered capacitance therebetween, or by other means.

Figure 10:
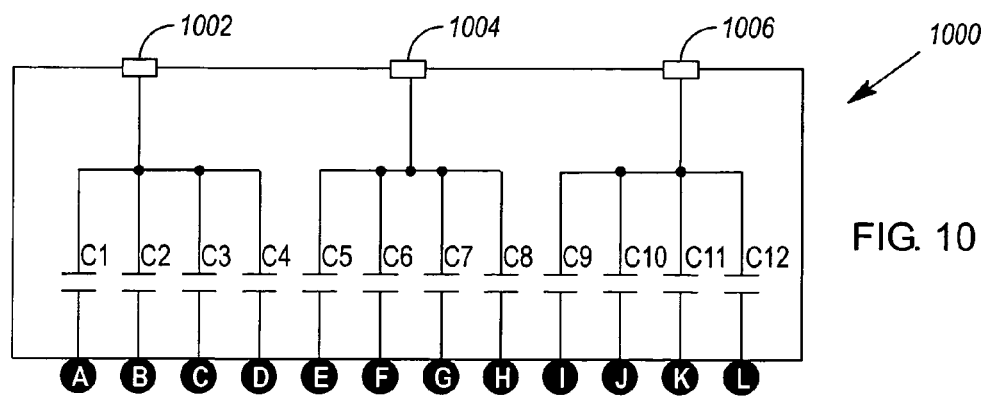
FIG. 10 illustrates a fifth exemplary embodiment of a device for testing continuity of electrical paths through a connector of a circuit assembly, wherein each of a number of parallel connected capacitors have different values.

The value of the parallel capacitors, C, and error, E, may be chosen or limited such that a particular capacitive lead-frame test assembly can distinguish between the combined capacitance of N versus N-1 capacitors (or distinguish between a multiple of N or N-1 times C). However, the sensitivity of a particular capacitive lead-frame test assembly will sometimes dictate the maximum value of N. In this case, a device 1000 may be provided with additional test sensor ports 1002, 1004, 1006 (see FIG. 10). The contacts (A–L) of the device 1000 may then be divided into groups such that a different set of passive components (e.g., C1–C4, C5–C8, C9–C12) is coupled in parallel between each set of contacts and its corresponding test sensor port 1002–1006. In testing a circuit assembly, a plurality of test buffers may be coupled to the device's test sensor ports 1002–1006 in parallel, or a single test buffer may be sequentially coupled to ones of the test sensor ports 1002–1006.

Up to this point, it has been assumed that the values of a number of parallel passive components are substantially matched. However, this need not be the case. For example, each of a device's parallel capacitors may have a different value. The different values may be variously chosen, but for ease of detection, the values may be chosen to be multiples of some common value (e.g., their different values may be C, 2C, 4C, 8C, ..., $2^N C$). A single fault (and even multiple fault) failure of a connector will therefore generate a capacitance reduction that is related to some unique multiple of C. In this manner, the location(s) of a fault or faults may be more easily determined.

By way of example, different values of capacitance may be achieved by coupling a different number of parallel coupled capacitors to each contact in a set of contacts. Alternately, the width of plates or length of lines forming different sides of a capacitor may be adjusted.

Figure 11:
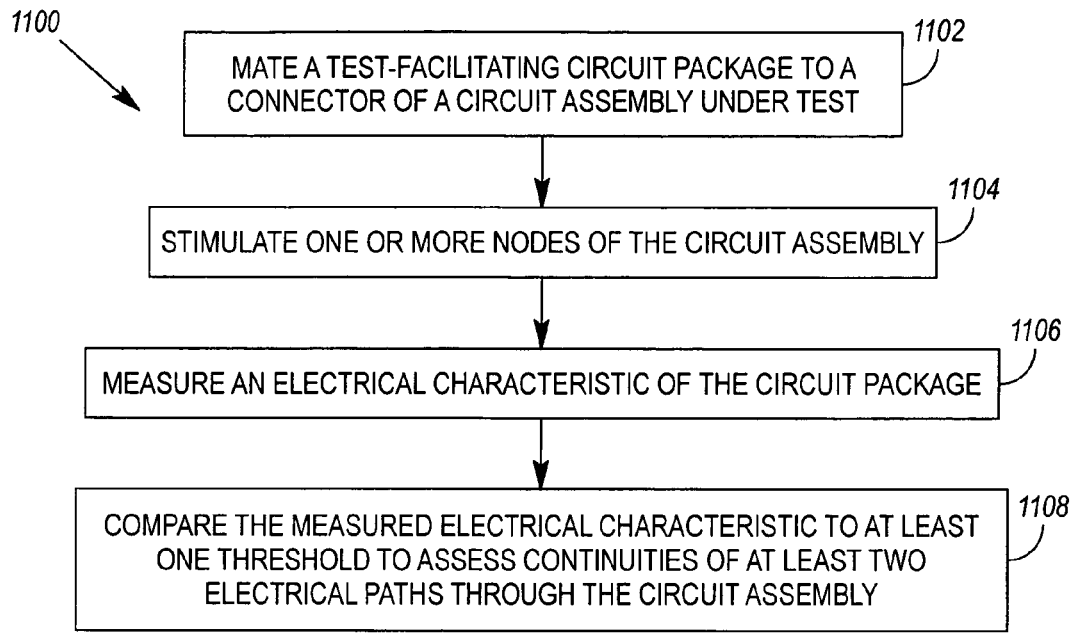
FIG. 11 illustrates a first exemplary method for testing continuity of electrical paths through a circuit assembly.

FIG. 11 illustrates a method 1100 for testing continuity of electrical paths through a circuit assembly using any of the above-described test devices (as well as others). The method 1100 commences with the mating 1102 of a test-facilitating circuit package to a connector of the circuit assembly. The circuit package 1) comprises a plurality of contacts for mating to a plurality of contacts of the connector, 2) contains incomplete or no mission circuitry for the circuit assembly, and 3) contains a plurality of passive circuit components coupled in parallel between the package's plurality of contacts and a test sensor port of the circuit package. The method 1100 continues with the stimulation 1104 of one or more nodes of the circuit assembly, followed by the measurement 1106 of an electrical characteristic of the circuit package (e.g., capacitance or resistance). Finally, the measured electrical characteristic is compared 1108 to at least one threshold (e.g., different combinations of capacitance or resistance) to assess continuities of at least two electrical paths through the circuit assembly. If the measured electrical characteristic is capacitance, the capacitance may be measured by means of a capacitive lead-frame assembly.

Figure 12:
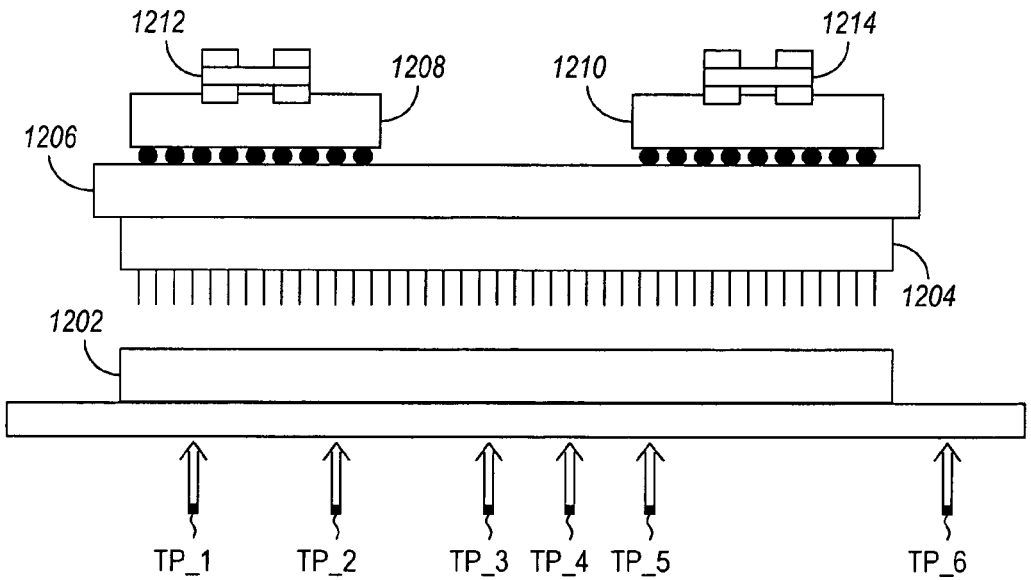
FIG. 12 illustrates how a plurality of the test devices shown in FIGS. 5–8 may be mounted on a printed circuit board or other substrate for the purpose of testing continuity of electrical paths through a connector that is too large for the packaging technology that is used to fabricate the test devices.

FIG. 12 illustrates how a plurality of the test devices shown in FIGS. 5–8 may be mounted on a printed circuit board 1206 or other substrate for the purpose of testing continuity of electrical paths through a connector 1202 that is too large for the packaging technology that is used to fabricate the test devices (or for testing a connector that is shaped differently than a test device 1208). The printed circuit board 1206 may comprise signal routes for routing contacts of a connector under test 1202 to contacts of the various test devices 1208, 1210 mounted thereon. The printed circuit board may also comprise (or be coupled to) a fixture 1204 for mating the printed circuit board 1206 and test devices 1208, 1210 to a connector 1202. The same or different test assemblies 1212, 1214 may be used to read the capacitance or other electrical characteristic of the test devices 1208, 1210.

Figure 13:
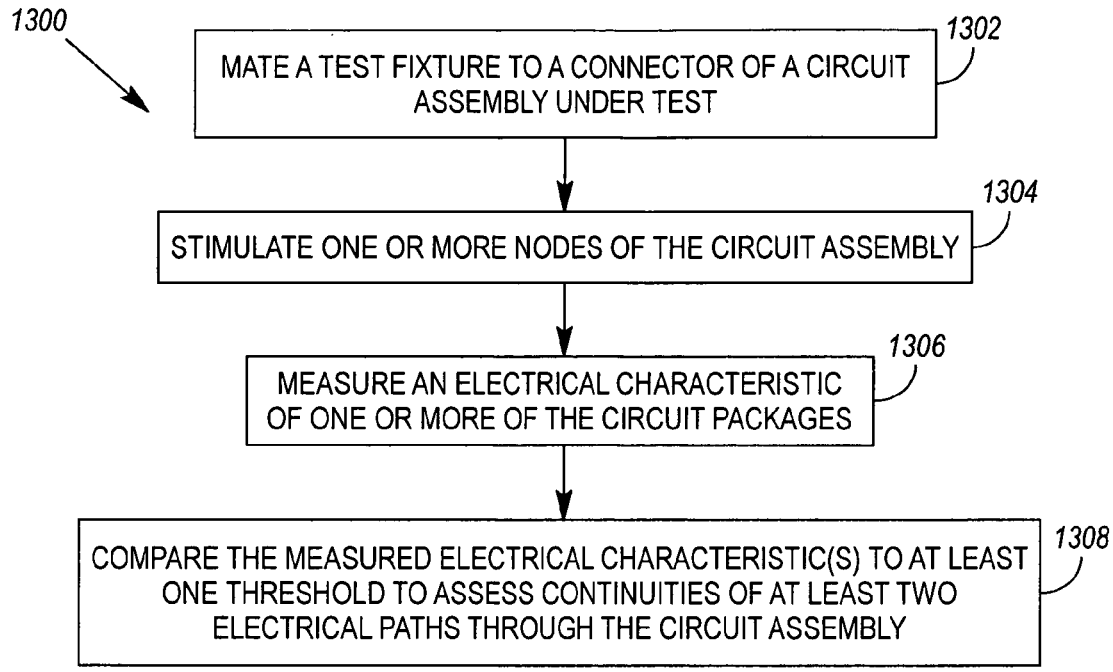
FIG. 13 illustrates a second exemplary method for testing continuity of electrical paths through a circuit assembly.

FIG. 13 illustrates a method 1300 for testing continuity of electrical paths through a circuit assembly using the device shown in FIG. 12. The method 1300 commences with the mating 1302 of a test fixture to a connector of the circuit assembly. The test fixture supports one or more test-facilitating circuit packages, each of which 1) comprises a plurality of contacts for electrically coupling to a plurality of contacts of the connector, 2) contains incomplete or no mission circuitry for the circuit assembly, and 3) contains a plurality of passive circuit components coupled in parallel between the package's plurality of contacts and test sensor ports of the circuit packages. The method continues with the stimulation 1304 of one or more nodes of the circuit assembly, followed by the measurement 1306 of an electrical characteristic of one or more of the circuit packages. Finally, the measured electrical characteristic(s) are compared 1308 to at least one threshold to assess continuities of at least two electrical paths of the circuit assembly. If the measured electrical characteristic is capacitance, the capacitance may be measured by means of a capacitive lead-frame assembly.

Figure 14:
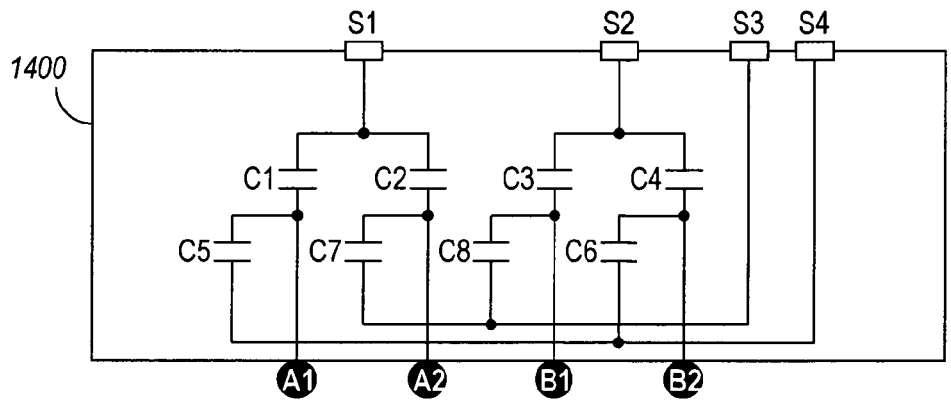
FIG. 14 illustrates a sixth exemplary embodiment of a device for testing continuity of electrical paths through a connector of a circuit assembly, wherein a fault addressing scheme is implemented.

FIG. 14 illustrates yet another device 1400 for testing continuity of electrical paths through a connector of a circuit assembly. The device once again comprises a package containing incomplete or no mission circuitry for the circuit assembly. On the package 1400 is a plurality of contacts (A1, A2, B1, B2) for mating to a plurality of contacts of the connector; and integrated with the package 1400 is a plurality of test sensor ports (S1, S2, S3, S4). A plurality of sets of passive circuit components (C1/C2, C3/C4, C5/C6, C7/C8) are enclosed within the package 1400. Each set of passive circuit components is coupled in parallel between a corresponding set of the plurality of contacts and one of the test sensor ports. The sets of the plurality of contacts intersect. For example, contact A1 is coupled to the C1/C2 set of components, as well as the C5/C6 set of components. In this manner, variations in capacitance seen by different ones of the test sensor ports can be used to determine where faults are located. For example, if there is a fault at contact A1, it will affect readings at test sensor ports S1 and S3. The contact which is included in both groups, A1, is therefore the location of the fault. Although the fault addressing scheme disclosed in FIG. 14 requires a lot of overhead for a 2×2 array, the overhead goes down substantially as the number of contacts in the array grows (i.e., as the number of contacts grows by a power of two ($N^2$), the number of test sensor ports required to uniquely address the contacts only grows by a factor of two (2N)).

While illustrative and presently preferred embodiments of the invention have been described in detail herein, it is to be understood that the inventive concepts may be otherwise variously embodied and employed, and that the appended claims are intended to be construed to include such variations, except as limited by the prior art.

What is claimed is:

1. A method for testing continuity of electrical paths through a circuit assembly, comprising:

mating a test-facilitating circuit package to a connector of the circuit assembly; the circuit package comprising a plurality of contacts for mating to a plurality of contacts of the connector; the circuit package containing incomplete or no mission circuitry for the circuit assembly, but containing a plurality of passive circuit components coupled in parallel between the package's plurality of contacts and a test sensor port of the circuit package;

stimulating one or more nodes of the circuit assembly;

measuring an electrical characteristic of the circuit package; and comparing the measured electrical characteristic to at least one threshold to assess continuities of at least two electrical paths through the circuit assembly.

2. The method of claim 1, wherein the electrical characteristic of the test fixture is measured via a capacitive lead-frame assembly.

3. A method for testing continuity of electrical paths through a circuit assembly, comprising:

mating a test fixture to a connector of the circuit assembly; the test fixture supporting one or more test-facilitating circuit packages; the circuit packages comprising a plurality of contacts for electrically coupling to a plurality of contacts of the connector; the circuit packages containing incomplete or no mission circuitry for the circuit assembly, but containing a plurality of passive circuit components coupled in parallel between the packages' plurality of contacts and test sensor ports of the circuit packages;

stimulating one or more nodes of the circuit assembly;

measuring an electrical characteristic of one or more of the circuit packages; and comparing the measured electrical characteristic(s) to at least one threshold to assess continuities of at least two electrical paths through the circuit assembly.

4. The method of claim 3, wherein the electrical characteristic of the test fixture is measured via a capacitive lead-frame assembly.

* * * * *